United States Patent
Moon et al.

(10) Patent No.: US 7,560,681 B2
(45) Date of Patent: Jul. 14, 2009

(54) IMAGE SENSOR AND MANUFACTURING METHOD THEREOF

(75) Inventors: Kyoung-Sik Moon, Hwaseong-si (KR); Bum-Suk Kim, Seoul (KR); Jong-Jin Lee, Seoul (KR); Yun-Ho Jang, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 39 days.

(21) Appl. No.: 11/797,561

(22) Filed: May 4, 2007

(65) Prior Publication Data

US 2008/0023624 A1    Jan. 31, 2008

(30) Foreign Application Priority Data

Jul. 25, 2006    (KR) ............... 10-2006-0069716

(51) Int. Cl.
- H01L 27/00 (2006.01)
- H01L 31/18 (2006.01)
- H01J 40/14 (2006.01)

(52) U.S. Cl. ............ 250/208.1; 250/216; 257/432; 257/E31.127; 438/72

(58) Field of Classification Search ............ 250/216, 250/208.1; 257/432, 436, 437, E31.127; 438/69, 72

See application file for complete search history.

(56) References Cited

U.S. PATENT DOCUMENTS

| | | | |
|---|---|---|---|
| 6,586,811 B2 * | 7/2003 | Sekine | 257/432 |
| 6,965,478 B2 * | 11/2005 | Tang | 359/626 |
| 7,005,627 B2 | 2/2006 | Lim | |
| 7,038,184 B2 | 5/2006 | Chang | |
| 2002/0070931 A1 * | 6/2002 | Ishikawa | 345/204 |
| 2005/0264863 A1 * | 12/2005 | Kwon et al. | 359/248 |
| 2007/0030380 A1 * | 2/2007 | Higuchi et al. | 348/340 |
| 2007/0070507 A1 * | 3/2007 | Yee et al. | 359/622 |
| 2007/0164329 A1 * | 7/2007 | Toshikiyo | 257/291 |
| 2008/0023624 A1 * | 1/2008 | Moon et al. | 250/216 |

FOREIGN PATENT DOCUMENTS

| | | |
|---|---|---|
| JP | 7298146 | 11/1995 |
| JP | 2004-311666 | 11/2004 |

OTHER PUBLICATIONS

Korean Office Action dated Jun. 13, 2007 for counterpart Korean Patent Application No. 10-2006-0069716.

* cited by examiner

*Primary Examiner*—John R Lee
(74) *Attorney, Agent, or Firm*—Harness, Dickey & Pierce

(57) ABSTRACT

An image sensor may include a plurality of photodiodes for performing a photo-electric conversion and a plurality of microlenses. Each of the microlenses is formed over one of the photodiodes. The image sensor may further include a vertical light generating portion formed over the microlenses and configured to refract each of plurality of incident light rays such that the light rays are vertically incident on the microlenses.

14 Claims, 5 Drawing Sheets

401  402

402
401

⇩ FORMING AND ETCHING OXIDE FILM

⇩ FORMING FIRST ANTI-REFLECTION
FILM AND NITRIDE FILM

⇩ FORMING SECOND ANTI-REFLECTION FILM

IMAGE SENSOR AND MANUFACTURING METHOD THEREOF

This application claims priority under 35 U.S.C. §119 to Korean Patent Application No. 2006-0069716, filed on Jul. 25, 2006, in the Korean Intellectual Property Office (KIPO), the entire contents of which are herein incorporated by reference.

BACKGROUND

1. Field

Example embodiments relate to an image sensor and manufacturing method thereof.

2. Description of the Related Art

Image sensors may include CMOS (complementary metal oxide semiconductor) type image sensors and CCD (charge coupled device) type image sensors. An image sensor may use a microlens to increase the amount of light input to a light receiving device and/or improve the efficiency in receiving light. As such, there has been an increase in the number of products (e.g., digital cameras) requiring image sensors.

FIG. 1 illustrates a conventional image sensor. Referring to FIG. 1, an image sensor 10 includes a plurality of photodiodes 100 and a plurality of microlenses 101. A plurality of principal rays 12 output from an external lens 11 is incident on a respective one of the microlenses 101 of the image sensor 10 at different incident angles.

The angles of the principal rays 12 incident on the photodiodes 100 in the image sensor 10 are different from one another. While almost vertical light (hereinafter the "vertical light") is incident on a pixel (e.g., photodiode) located in the central area of the image sensor 10, the angle of each of the principal rays 12 incident on each pixel increases from the central area towards the edge of the image sensor 10.

As illustrated in circle X of FIG. 1, one of the principal rays 12 incident at an angle on a certain pixel is incident on at least one neighboring pixel, which causes reduced sensitivity of the image sensor and increased cross talk. As a result, the image sensor is directly affected by this phenomenon and the quality of an image produced by the image sensor is degraded and requires additional circuits to correct the quality of the image.

To solve the aforementioned problem, the position of the respective microlenses 101 may be relocated to the central area of the image sensor 10 or the height between each of the microlenses 101 and each of the photodiodes 100 may be decreased to reduce dependency upon the incident angle of the principal ray or light incident on each pixel. However, these methods may not be feasible solutions due to the complex structure and manufacturing process of the image sensor.

SUMMARY

Example embodiments provide an image sensor in which principal rays having different incident angles may be refracted vertically incident on a pixel, thereby reducing or preventing the generation of cross talk and the degradation of light sensitivity. Example embodiments also provide a method of manufacturing an image sensor which may reduce or remove the complexity of the structure and manufacturing process of an image sensor due to the shifting of microlenses.

According to example embodiments, an image sensor may include a plurality of photodiodes configured to perform a photo-electric conversion, a plurality of microlenses, each formed over a respective one of the photodiodes, and a vertical light generating portion formed over the plurality of microlenses and configured to refract each of a plurality of incident light rays such that the plurality of light rays are vertically incident on the microlenses. The image sensor may further include a material film on the vertical light generating portion having a refractive index higher than that of the vertical light generating portion, an anti-reflection film between the vertical light generating portion (which may be embodied by a Fresnel lens or the shape of a Fresnel lens) and the material film, a first anti-reflection film on the Fresnel lens, a nitride film on the first anti-reflection film, and a second anti-reflection film on the nitride film.

According to example embodiments, a method of manufacturing an image sensor may include forming a plurality of photodiodes configured to perform a photo-electric conversion on a substrate, forming a plurality of microlenses on a respective one of the photodiodes, and forming a vertical light generating portion over the plurality of microlenses. The vertical light generating portion may be configured to refract each of a plurality of incident light rays such that the plurality of light rays are vertically incident on the microlenses.

The forming of the vertical light generating portion may include forming a first oxide film having a refractive index different than that of the upper surface of a microlens and forming the shape of a Fresnel lens by etching an upper portion of the first oxide film. The refractive index of the first oxide film may be lower than that of each of the microlenses. The first oxide film may be a silicon oxide. The first anti-reflection film may be formed on the first oxide film and may be formed to have the shape of a Fresnel lens.

A second oxide film having a refractive index different than that of the first oxide film and flattening the first oxide film formed to have the shape of a Fresnel lens may be formed on the first anti-reflection film. The refractive index of the second oxide film may be higher than that of the first oxide film. The second oxide film may be a silicon nitride. A second anti-reflection film may be formed on the second oxide film.

In the image sensor, light rays may be input at different incident angles according to the area of the image sensor by a lens used to form an image. As such, the angle of the light incident on the respective photodiodes may increase from the central area in the direction towards the edge of the image sensor. The light incident at a greater angle may affect not only a photodiode but also the neighboring photodiodes such that the sensitivity of the image sensor may be degraded and cross talk may be generated. Thus, the image sensor may be deteriorated such that the quality of an image produced by the image sensor may be degraded.

The problems of the sensitivity of the image sensor and the cross talk may be solved by making the light ray incident on the image sensor to be vertically incident regardless of the position of the respective photodiodes. Accordingly, in the image sensor according to example embodiments, a vertical light generating portion may include principal rays having different incident angles vertically incident on the respective photodiodes by refracting the principal rays arranged between the microlenses and the external lens.

A Fresnel lens having a smaller thickness and a simplified manufacturing process which may reduce or minimize the increase in the size of the image sensor may be an example of the vertical light generating portion. Because the Fresnel lens may be manufactured to be thinner and the Fresnel lens may concentrate light to be vertically incident (e.g., similar to a convex line), the light incident at an angle on the Fresnel lens by an external lens may be changed to light that is perpendicular by the Fresnel lens.

By appropriately adjusting the size of the respective concentric circles forming the Fresnel lens according to the size of the external lens and the distance between the external lens and the Fresnel lens, the light incident at an angle by the external lens may be controlled to be vertically incident on the respective pixels.

BRIEF DESCRIPTION OF THE DRAWINGS

Example embodiments will be more clearly understood from the following detailed description taken in conjunction with the accompanying drawings. FIGS. 1-5D represent non-limiting, example embodiments as described herein.

FIG. 1 illustrates a conventional image sensor;

FIG. 2 illustrates an image sensor according to an example embodiment;

FIG. 3 illustrates an image sensor adopting a Fresnel lens as an example of the vertical light generating portion of FIG. 2;

FIGS. 5A-5D illustrate an example embodiment of the manufacturing process of an image sensor including a Fresnel lens.

DETAILED DESCRIPTION OF EXAMPLE EMBODIMENTS

Figure 1:
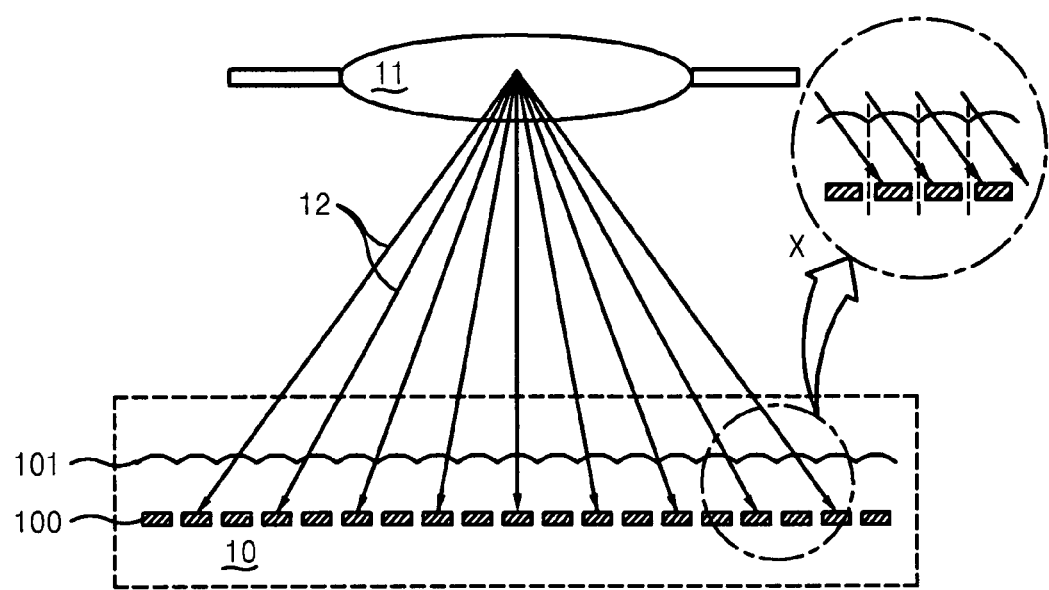

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
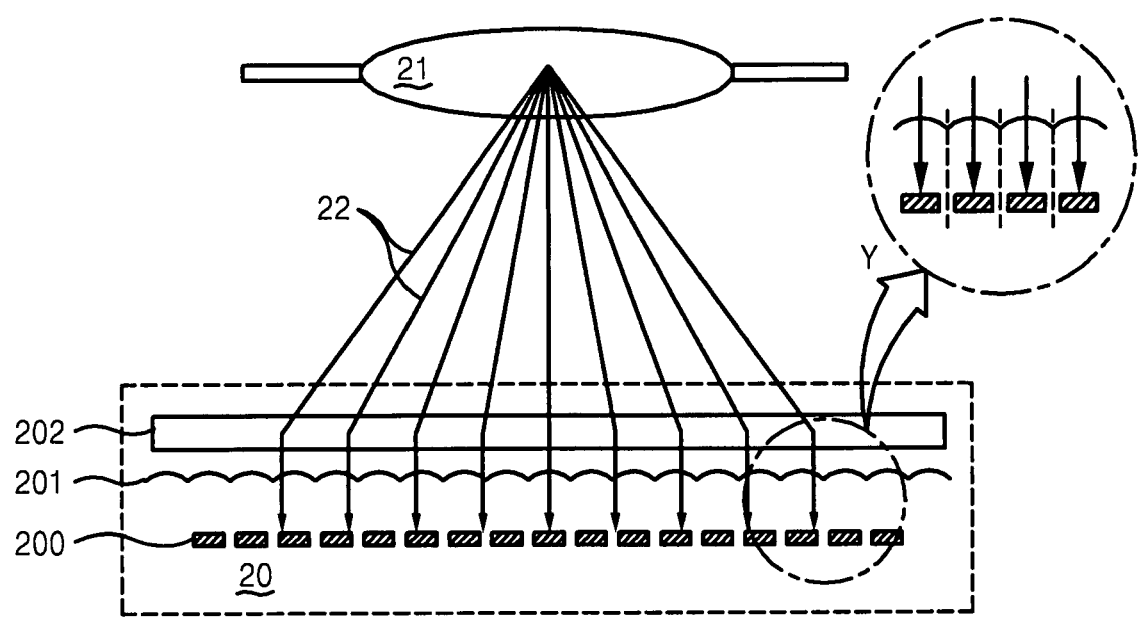

FIG. 2 illustrates an image sensor according to an example embodiment. Referring to FIG. 2, each of principal rays 22 output from an external lens 21 may be incident on an image sensor 20. The image sensor 20 may include a plurality of light receiving elements 200 formed in a substrate (not shown), a plurality of microlenses 201 formed on the corresponding light receiving elements 200, and a vertical light generating portion 202.

Each of the light receiving elements 200 may be embodied by a photodiode, phototransistor, photogate, pinned photodiode, and/or etc. Each of the light receiving elements 200 may perform a photo-electric conversion.

The vertical light generating portion 202 may be arranged above the microlenses 201 and may refract each of the principal rays 22 incident thereon at different angles such that each of the principal rays 22 may be vertically incident on each of the corresponding microlenses 201. Thus, the vertical light generating portion 202 may change the route of each of the principal rays 22.

In FIG. 2, circle Y shows each of the principal rays 22 incident on each of the microlenses 201 after being converted to a vertical light ray by the vertical light generating portion 202. The respective principal rays 22 incident on the vertical light generating portion 202 at different angles may be refracted by the vertical light generating portion 202 by corresponding angles and may be vertically incident on the light receiving elements (e.g., photodiodes) 200 through the microlenses 201 corresponding to the respective principal rays 22. Thus, the cross talk between the pixels (e.g., photodiodes) in the entire area of the image sensor 20 may be reduced or prevented. Also, the generation of the difference in light sensitivity according to the position of each pixel may be reduced or prevented.

Unlike the conventional image sensor, the image sensor according to example embodiments may not adopt a method of shifting the microlenses 201. As such, the structure and manufacturing process of the image sensor may be less complex.

The vertical light generating portion 202 may vertically convert the respective principal rays 22 incident at different angles. A Fresnel lens may be an appropriate example of the vertical light generating portion 202.

Figure 3:
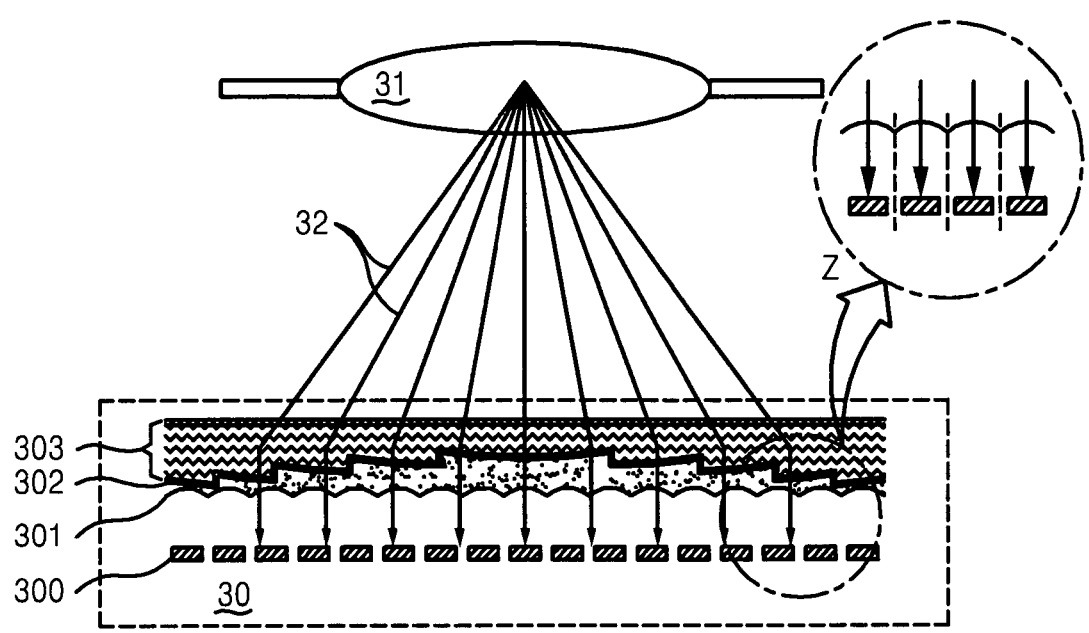

FIG. 3 illustrates an image sensor adopting a Fresnel lens as an example of the vertical light generating portion 202 of FIG. 2. Referring to FIG. 3, each of the principal rays 32 output from an external lens 31 may be incident on an image sensor 30. The image sensor 30 may include a plurality of light receiving elements 300, a plurality of microlenses 301 arranged above the corresponding light receiving elements 300, and a Fresnel lens 302 arranged above the microlenses 301 and refracting each of the principal rays 32 having different incident angles. Each of the principal rays 32 may be converted into vertical rays for input to each of the microlenses 301 corresponding to each ray.

A Fresnel lens 302 may have a lower surface matching the curved surface of each of the microlenses 301 and an upper surface refracting each of the light rays 32 thereon.

A plurality of additional films 303, including an anti-reflection coating to reduce or prevent degradation of light sensitivity, may be arranged on the Fresnel lens 302. The additional films 303 may include a plurality of anti-reflection coatings and a desired, or alternatively, a predetermined oxide film, which will be described later.

In FIG. 3, circle Z shows the rays 32 incident on the microlenses 301 after being converted to vertical light and/or rays by the Fresnel lens 302. When the vertical light is incident on the respective pixels (e.g., photodiodes), cross talk between the pixels may be reduced or prevented. Also, the generation of the difference in light sensitivity due to the position of the respective pixels may be reduced or prevented.

A material deposited or coated on the microlenses 301 may be silicon oxide, which may have a refractive index less than that of the microlenses 301. The silicon oxide may form a silicon oxide film. Materials having a low refractive index (e.g., a family to which silicon oxide belongs or a fiber material such as polymer or resin) may be appropriate. The Fresnel lens 302 or the shape of the Fresnel lens may be formed from the silicon oxide and the anti-reflection coating or anti-reflection film may be formed thereon.

The Fresnel lens 302 is a flat lens having a smaller thickness and a higher level of brightness such that the Fresnel lens 302 may be appropriately integrated with an image sensor having a flat structure.

The additional films 303 may include a first anti-reflection film and a second anti-reflection film. The first anti-reflection film may reduce or prevent reflection generated due to a difference in reflectivity between a material having a low refractive index (e.g., silicon oxide) deposited on the upper surface of the microlenses 301 and a material having a high refractive index (e.g., silicon nitride) deposited after etching. The second anti-reflection film may reduce or prevent the light reflected when vertical light is incident. The first anti-reflection film may be formed of a material having a medium refractive index, which may be between the refractive indices of the two materials (e.g. silicon oxide and silicon nitride) having different refractivities. The first anti-reflection film may be obtained by adjusting the composition of the silicon oxide or the silicon nitride. The second anti-reflection film may be a film having a lower refractive index including $MgF_2$ or $Na_3AlF_6$.

Figure 4A:
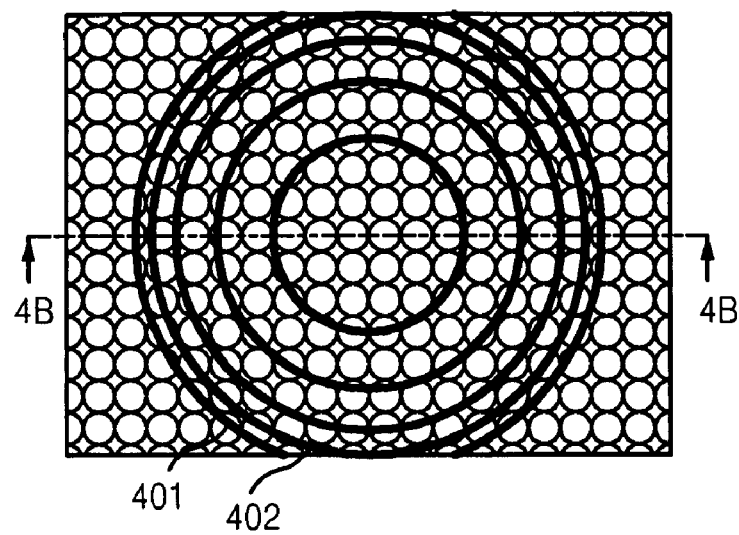
FIG. 4A illustrates an image sensor including a Fresnel lens and FIG. 4B illustrates a cross-sectional view of an image sensor including a Fresnel lens according to an example embodiment.
Figure 4B:
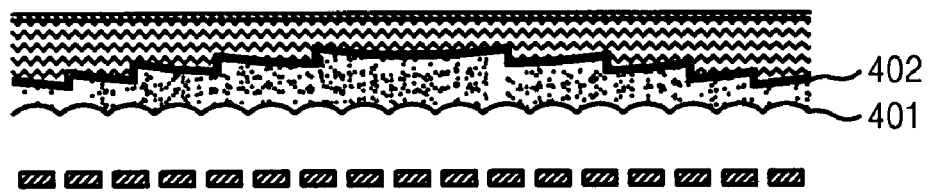

FIG. 4A illustrates an image sensor including a Fresnel lens and FIG. 4B illustrates a cross-sectional view of an image sensor including a Fresnel lens according to an example embodiment. Referring to FIG. 4A, a Fresnel lens 402 including a plurality of concentric circles may be arranged above a plurality of microlenses 401. FIG. 4B is a cross-sectional view taken along line 4B-4B of FIG. 4A, in which the Fresnel lens 402 may be deposited above the microlenses 401.

FIGS. 5A-5D illustrate the manufacturing process of an image sensor including a Fresnel lens according to an example embodiment. As described above, example embodiments may reduce the complexity of the manufacturing process. The manufacturing process of an image sensor according to an example embodiment will now be described with reference to FIGS. 5A-5D.

Figure 5A:

Referring to FIG. 5A, a plurality of photodiodes 50 for receiving light may be formed on a substrate (not shown) and a plurality of microlenses 51 may be formed on the photodiodes 50. The image sensor may include a variety of types, for example, a CMOS type or a CCD type. The description of other constituent elements, except for the microlenses 51 and the photodiodes 50, will be omitted for the convenience of illustration and explanation.

Figure 5B:

Referring to FIG. 5B, silicon oxide ($SiO_2$), having a lower refractive index than that of each of the microlenses 51, may be deposited to a desired, or alternatively, a predetermined thickness on the upper surface of the microlenses 51. A Fresnel lens or Fresnel lens shape 52 may be formed directly on the silicon oxide (or oxide film) through an etching process. The Fresnel lens or Fresnel lens shape 52 including a plurality of concentric circles on a plane may be formed directly on the silicon oxide (or silicon film). As a result, the Fresnel lens or Fresnel lens shape 52 may be integrated with the image sensor. In the etching process, an ion beam etching method may be used to increase the accuracy of the concentric circles constituting the Fresnel lens 52.

Figure 5C:
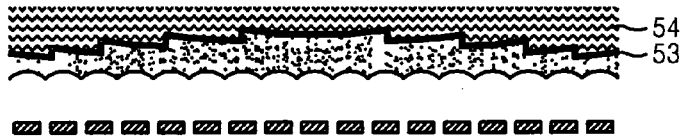

Referring to FIG. 5C, to improve light sensitivity, a first anti-reflection film 53 may be formed on the Fresnel lens 52. Then, a silicon nitride film 54 may be formed on the first anti-reflection film 53. The silicon nitride film 54 may be formed of a silicon nitride having a higher refractive index than that of the silicon oxide forming the Fresnel lens 52. The silicon nitride may make the shape of the Fresnel lens 52 flatter.

Figure 5D:
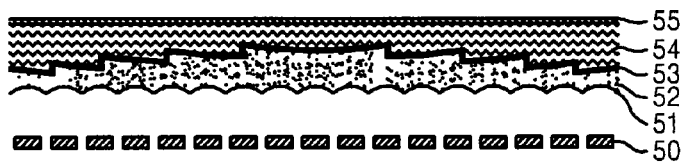

Referring to FIG. 5D, in order to reduce light reflection when vertical light is incident, a second anti-reflection film 55 (e.g., a film including $MgF_2$ or $Na_3AlF_6$, and having a lower refractive index) may be formed on the silicon nitride film 54. A silicon oxide film may be formed of a silicon oxide and a silicon nitride film may be formed of a silicon nitride.

According to example embodiments, because the light incident on the microlens is made to be vertical regardless of the position of the pixels, the degradation of light sensitivity and/or the generation of cross talk due to the difference in the incident angle of the light rays according to the pixel positions may be reduced or prevented. Also, because the above effects may be obtained without a shift of the microlenses, the structure and manufacturing process of the image sensor may be simplified.

Although example embodiments have been shown and described in this specification and figures, it would be appreciated by those skilled in the art that changes may be made to the illustrated and/or described example embodiments without departing from their principles and spirit.

What is claimed is:

1. An image sensor comprising:
   a plurality of light receiving elements configured to perform a photo-electric conversion;
   a plurality of microlenses, each formed over a respective one of the light receiving elements;
   a vertical light generating portion formed over the microlenses and configured to refract incident light rays such that the light rays are vertically incident on the microlenses; and
   a material film over the vertical light generating portion that has a refractive index higher than that of the vertical light generating portion.

2. The image sensor of claim 1, further comprising:
   an anti-reflection film formed between the vertical light generating portion and the material film.

3. The image sensor of claim 1, wherein the vertical light generating portion has a lower surface matching a curved surface of each of the microlenses and an upper surface refracting the light rays.

4. The image sensor of claim 3, wherein the vertical light generating portion includes a Fresnel lens.

5. The image sensor of claim 4, further comprising:
   an oxide film over the Fresnel lens.

6. The image sensor of claim 4, further comprising:
   a first anti-reflection film on the Fresnel lens;
   a nitride film on the first anti-reflection film; and
   a second anti-reflection film on the nitride film.

7. The image sensor of claim 6, wherein the second anti-reflection film includes one of $MgF_2$ and $Na_3AlF_6$.

8. A method of manufacturing an image sensor, the method comprising:
   forming a plurality of light receiving elements on a substrate, each of the light receiving elements configured to perform a photo-electric conversion;
   forming a plurality of microlenses, each being formed on a respective one of the light receiving elements; and
   forming a vertical light generating portion over the microlenses, the vertical light generating portion configured to refract incident light rays such that the light rays are vertically incident on the microlenses,
   wherein the vertical light generating portion has a lower surface matching a curved surface of each of the microlenses and an upper surface refracting the light rays,
   wherein the forming of the vertical light generating portion step includes:
   forming a first oxide film having a refractive index different than that of each of the microlenses and forming the shape of a Fresnel lens by etching the upper portion of the first oxide film,
   wherein the refractive index of the first oxide film is lower than that of each of the microlenses.

9. The method of claim 8, wherein the first oxide film is a silicon oxide.

10. The method of claim 8, further comprising:
    forming a first anti-reflection film on the first oxide film.
    pg,14

11. The method of claim 10, further comprising:
    forming a second film on the first anti-reflection film to form a flat surface, the second film having a refractive index different than that of the first oxide film.

12. The method of claim 11, wherein the refractive index of the second film is higher than that of the first oxide film.

13. The method of claim 11, wherein the second film is a silicon nitride.

14. The method of claim 11, further comprising: forming a second anti-reflection film on the second film.

* * * * *